(12) United States Patent
Adachi et al.

(10) Patent No.: US 11,125,798 B2
(45) Date of Patent: Sep. 21, 2021

(54) POWER DISTRIBUTION NETWORK MONITORING SYSTEM AND POWER DISTRIBUTION NETWORK MONITORING DEVICE

(71) Applicant: Omron Corporation, Kyoto (JP)

(72) Inventors: Tatsuya Adachi, Ichinomiya (JP); Hiroaki Takeya, Aichi (JP); Mitsunori Sugiura, Nagoya (JP); Yuji Funasaka, Ichinomiya (JP)

(73) Assignee: Omron Corporation, Kyoto (JP)

( * ) Notice: Subject to any disclaimer, the term of this patent is extended or adjusted under 35 U.S.C. 154(b) by 201 days.

(21) Appl. No.: 16/481,112

(22) PCT Filed: Nov. 17, 2017

(86) PCT No.: PCT/JP2017/041396
§ 371 (c)(1),
(2) Date: Jul. 26, 2019

(87) PCT Pub. No.: WO2018/168077
PCT Pub. Date: Sep. 20, 2018

(65) Prior Publication Data
US 2021/0011071 A1    Jan. 14, 2021

(30) Foreign Application Priority Data

Mar. 15, 2017  (JP) .............................. JP2017-050431

(51) Int. Cl.
*G01R 31/08* (2020.01)
*H02J 13/00* (2006.01)
*H04Q 9/00* (2006.01)

(52) U.S. Cl.
CPC ........ *G01R 31/08* (2013.01); *H02J 13/00002* (2020.01); *H04Q 9/00* (2013.01); *H04Q 2209/30* (2013.01); *H04Q 2209/40* (2013.01)

(58) Field of Classification Search
CPC ..... G01R 31/08; H02J 13/00002; H04Q 9/00; H04Q 2209/30; H04Q 2209/40
See application file for complete search history.

(56) References Cited

U.S. PATENT DOCUMENTS 6,477,475 B1 * 11/2002 Takaoka ................. G01R 31/08
324/535
2015/0212138 A1   7/2015 Tsuchiya et al.
(Continued)

FOREIGN PATENT DOCUMENTS

JP          S6045899 A     3/1985
JP          H06-178355 A   6/1994
(Continued)

OTHER PUBLICATIONS

Notification of Reasons for Refusal issued in Japanese Application No. 2017-050431, dated Apr. 28, 2020 (9 pages).
(Continued)

*Primary Examiner* — Manuel A Rivera Vargas
(74) *Attorney, Agent, or Firm* — Osha Bergman Watanabe & Burton LLP

(57) ABSTRACT

A power distribution network monitoring system detects abnormalities that occur in a power distribution network using measuring instruments installed in the power distribution network. The power distribution network monitoring system includes a plurality of measuring instruments that are installed at predetermined positions on power lines on an upstream side of the downmost-stream power demander, among the power lines constituting the power distribution network and configured to perform electrical measurement of the power lines; and an abnormality detector configured to determine whether or not data related to the measurement result measured by the measuring instrument has been
(Continued)

received a predetermined number of times within a predetermined length of time, and detect the abnormality.

11 Claims, 12 Drawing Sheets

(56) References Cited

U.S. PATENT DOCUMENTS

| | | | |
|---|---|---|---|
| 2016/0025778 A1 | 1/2016 | Tokusaki et al. | |
| 2016/0156227 A1* | 6/2016 | Nagashima | H02J 13/00004 307/31 |

FOREIGN PATENT DOCUMENTS

| | | |
|---|---|---|
| JP | H06215275 A | 8/1994 |
| JP | H11-212637 A | 8/1999 |
| JP | 2000-201441 A | 7/2000 |
| JP | 2003-50620 A | 2/2003 |
| JP | 2003-250231 A | 9/2003 |
| JP | 2008-22676 A | 1/2008 |
| JP | 2010-4263 A | 1/2010 |
| JP | 2010-183734 A | 8/2010 |
| JP | 2011-211820 A | 10/2011 |
| JP | 2012-215969 A | 11/2012 |
| JP | 2012-249445 A | 12/2012 |
| JP | 2014-36482 A | 2/2014 |
| JP | 2014-178238 A | 9/2014 |
| JP | 2016-95683 A | 5/2016 |

OTHER PUBLICATIONS

English Translation of the International Search Report issued in Application No. PCT/JP2017/041396, dated Feb. 6, 2018(2 pages).
English Translation of the Written Opinion issued in Application No. PCT/JP2017/041396, dated Feb. 6, 2018 (4 pages).
English Translation of International Preliminary Report on Patentability issued in Application No. PCT/JP2017/041396, dated Jan. 31, 2019 (5 pages).
Office Action issued in Japanese Application No. 2017-050447; dated Nov. 4, 2020 (15 pages).
International Search Report issued in Application No. PCT/JP2017/041396, dated Feb. 6, 2018 (2 pages).
Written Opinion issued in Application No. PCT/JP2017/041396, dated Feb. 6, 2018 (4 pages).
International Preliminary Report on Patentability issued in Application No. PCT/JP2017/041396, dated Jan. 31, 2019 (5 pages).
International Search Report issued in Application No. PCT/JP2017/041407, dated Jan. 9, 2018 (2 pages).
Written Opinion issued in Application No. PCT/JP2017/041407, dated Jan. 9, 2018 (4 pages).

* cited by examiner

Setting information

| Area code | A01 | | |
|---|---|---|---|
| Relay management code | A01_01 | ... | A01_m |
| CT sensor ID | 001 | 002 | ... | 00n |

| Area code | A02 | | |
|---|---|---|---|
| Relay management code | A02_01 | A02_02 | ... | A02_m |
| CT sensor ID | 001 | 002 | ... | 00n |

| Time information | 2017/2/6/09:58:55 |
|---|---|

Measurement information

| Area code | Relay management code | CT sensor ID | Time information | Measurement result |
|---|---|---|---|---|
| A01 | A01_01 | 001 | 2017/2/6/09:02:30 | 100mA |
| | | | 2017/2/6/09:08:30 | 101mA |
| | | | 2017/2/6/09:14:30 | 105mA |
| | | | 2017/2/6/09:20:30 | 107mA |
| | | | 2017/2/6/09:26:30 | 106mA |
| | | | 2017/2/6/09:32:30 | 104mA |
| | | | 2017/2/6/09:38:30 | 108mA |
| | | | 2017/2/6/09:44:30 | 103mA |
| | | | 2017/2/6/09:50:30 | 105mA |
| | | | 2017/2/6/09:56:30 | 104mA |
| | | 002 | 2017/2/6/09:00:00 | abnomal |
| | A01_02 | . | . | : |
| A02 | A02_01 | 001 | 2017/2/6/09:08:30 | 95mA |

FIG. 7

Setting information

| Relay management code | A01_01 | | | |
|---|---|---|---|---|
| CT sensor ID | 001 | 002 | ... | 00n |
| Time information | 2017/2/6/10:00:08 | | | |

FIG. 8

Measurement information

| CT sensor ID | Time information | Measurement result |
|---|---|---|
| 001 | 2017/2/6/09:02:30 | 100mA |
| | 2017/2/6/09:08:30 | 101mA |
| | 2017/2/6/09:14:30 | 105mA |
| | 2017/2/6/09:20:30 | 107mA |
| | 2017/2/6/09:26:30 | 106mA |
| | 2017/2/6/09:32:30 | 104mA |
| | 2017/2/6/09:38:30 | 108mA |
| | 2017/2/6/09:44:30 | 103mA |
| | 2017/2/6/09:50:30 | 105mA |
| | 2017/2/6/09:56:30 | 104mA |
| 002 | 2017/2/6/09:03:42 | 95mA |
| | 2017/2/6/09:09:42 | 98mA |
| 003 | 2017/2/6/09:01:19 | 99mA |
| ⋮ | ⋮ | ⋮ |

FIG. 9

Position information management table

| Area code | Relay management code | CT sensor ID | Position code |
|---|---|---|---|
| A01 | A01_01 | 001 | 35.323890,136.758432 |
| | | 002 | 35.323892,136.758434 |
| | ... | ... | ... |
| | A01_m | 002 | 35.324471, 136.761068 |
| | A02_01 | 001 | 35.170220, 136.882467 |
| | ... | ... | ... |

FIG. 14

POWER DISTRIBUTION NETWORK MONITORING SYSTEM AND POWER DISTRIBUTION NETWORK MONITORING DEVICE

TECHNICAL FIELD

The present invention relates to a power distribution network monitoring system and a power distribution network monitoring device for detecting abnormalities in a power distribution network.

BACKGROUND ART

Recent years have seen the use of a measurement device that is attached to the power lines constituting a power distribution network and measures a physical quantity by converting it into a current value with a current transformer (CT).

For instance, Patent Literature 1 discloses a configuration of a measurement device for accurately sensing the current flowing through a power line that is part of a power distribution network.

By constructing a power distribution network monitoring system that makes use of such a measurement device to enable electrical measurement of the power lines that make up the power distribution network, a system can be provided for dealing with electricity theft, in which power is taken off from the power lines without permission, for example.

CITATION LIST

Patent Literature

Patent Literature 1: JP-A 2014-178238

SUMMARY

Technical Problem

However, the following problems are encountered with the above-mentioned conventional power distribution network monitoring system.

With the power distribution network monitoring system disclosed in the above-mentioned publication, there is the risk that the current sensors or other such measuring instruments may be broken, destroyed, stolen, or the like due to natural phenomena such as storms or to mischief perpetrated by people.

An object of the present invention is to provide a power distribution network monitoring system and a power distribution network monitoring device capable of effectively detecting the occurrence of an abnormality on a power distribution network that includes power lines to which measuring instruments are attached.

Solution to Problem

The power distribution network monitoring system according to the first invention is a power distribution network monitoring system that detects abnormalities that occur in a power distribution network using measuring instruments installed in the power distribution network, the power distribution network monitoring system comprising a plurality of measuring instruments and an abnormality detector. The measuring instruments are installed at predetermined positions on the power lines constituting the power distribution network and perform electrical measurement of the power lines. The abnormality detector determines whether or not data related to the measurement result measured by the measuring instrument has been received a predetermined number of times within a predetermined length of time, and detects the abnormality.

Here, in a system that detects various abnormalities that occur in a power distribution network by using measuring instruments installed in the power lines constituting the power distribution network, the abnormality detector determines whether or not data related to the result of electrical measurement of the power line as measured by a measuring instrument has been received a predetermined number of times within a predetermined length of time, and detects whether or not there is an abnormality.

That is, with this power distribution network monitoring system, for example, data about the measurement result is set to be transmitted from the measuring instrument to the abnormality detector each time a predetermined length of time elapses, and if the measurement result has not been received a predetermined number of times (such as ten times) within a predetermined length of time (such as 60 minutes), it is determined that some kind of abnormality has occurred in the measuring instrument or in the power distribution network.

Here, abnormalities occurring in the distribution network include, for example, failure, destruction, or theft of a measuring instrument, communication failure between a measuring instrument and the abnormality detector, and the like, in addition to a power outage in the power distribution network.

Also, data related to the measurement result transmitted from a measuring instrument may be, for example, data about the measurement result for the current and voltage of the power line, or data about the effective value of the alternating current calculated from a measurement value.

Communication between a measuring instrument and the abnormality detector is not limited to direct communication, and may be indirect communication via a relay or the like. Furthermore, communication between a measuring instrument and the abnormality detector may be wireless communication or wired communication.

Furthermore, the abnormality detector may be provided inside the measuring instrument, or may be provided to an device other than the measurement component.

Consequently, when the measuring instrument and the power distribution network are normal, data about the measurement result can be received a predetermined number of times within a predetermined length of time, but if the data is not received the predetermined number times, it is determined that some kind of abnormality has occurred, and the conclusion is that there is an abnormality.

As a result, when data related to the measurement result is not properly received using the measuring instrument installed in the power line constituting the power distribution network, the occurrence of an abnormality in the power distribution network can be effectively detected.

The power distribution network monitoring system according to the second invention is the power distribution network monitoring system according to the first invention, further comprising a data collection relay that receives data related to the measurement result from the plurality of measuring instruments and transmits the data to the abnormality detector.

Here, a data collection relay that receives data related to the measurement result from the plurality of measuring instruments and transmits the data to the abnormality detector is provided between the measuring instruments and the abnormality detector.

Consequently, data related to the measurement result can be transmitted to the abnormality detector at specific time intervals via the data collection relay that has received data related to the measurement result from the plurality of measuring instruments.

The power distribution network monitoring system according to the third invention is the power distribution network monitoring system according to the second invention, wherein the data collection relay includes a first data collection relay that receives data related to the measurement result from the plurality of measuring instruments installed in a first area, and a second data collection relay that receives data related to the measurement result from the plurality of measuring instruments installed in a second area.

Here, one data collection relay (first and second data collection relays) is set for each area (first and second areas) in which a plurality of measuring instruments are installed. Consequently, the power distribution network can be divided into a plurality of areas and the presence or absence of abnormalities can be managed by confirming that data has not been received a predetermined number of times from the measuring instruments installed in any area within a predetermined length of time.

The power distribution network monitoring system according to the fourth invention is the power distribution network monitoring system according to any of the first to the third inventions, wherein the plurality of measuring instruments perform electrical measurement of the power line each time a predetermined length of time has elapsed.

Here, the plurality of measuring instruments installed in the power lines constituting the power distribution network measure the current, voltage, and so forth of the power lines each time a predetermined length of time has elapsed.

Consequently, the abnormality detector receives a measurement result measured at specific time intervals from the plurality of measuring instruments, and if any abnormality has occurred in the power distribution network, it can be easily detected by confirming the number of receptions.

The power distribution network monitoring system according to the fifth invention is the power distribution network monitoring system according to any of the first to the fourth inventions, further comprising a storage unit that stores data related to the measurement result received from the plurality of measuring instruments and the abnormality detection result.

Here, the power distribution network monitoring system is provided with a storage unit for storing data related to the measurement result in a plurality of measurement components, and an abnormality detection result.

This makes it possible to refer to the data related to the past measurement results and abnormality detection results and take measures such as inspecting and repairing the power lines of the power distribution network in which the measuring instrument where the abnormality occurred is installed.

The power distribution network monitoring system according to the sixth invention is the power distribution network monitoring system according to any of the first to fifth inventions, wherein the abnormalities include failure, theft, or destruction of the measuring instruments, a power outage in the power distribution network, and a communication failure between the measuring instruments and the abnormality detector.

Here, examples of the abnormalities detected by this power distribution network monitoring system include failure, theft, or destruction of the measuring instruments, a power outage in the power distribution network, and a communication failure between the measuring instruments and the abnormality detecting unit.

Consequently, the occurrence of various abnormalities can be easily detected by confirming the number of receptions from a measuring instrument when some kind of abnormality occurs in the power distribution network.

The power distribution network monitoring system according to the seventh invention is the power distribution network monitoring system according to any of the first to the sixth inventions, further comprising a notification unit that gives notification related to an abnormality when the abnormality detector has determined that there is an abnormality.

Here, when the abnormality detector determines that there is an abnormality, the notification unit gives a notification that an abnormality has occurred.

Here, the notification method employed by the notification unit includes displaying text information advising of the occurrence of an abnormality on a display unit or the like, emitting audio information, emitting an alarm sound, and so on.

Consequently, for example, a manager who has received the notification from the notification unit can take measures such as inspecting and repairing the power line of the power distribution network on which the measuring instrument where the abnormality has occurred is installed.

The power distribution network monitoring system according to the eighth invention is the power distribution network monitoring system according to any of the first to seventh inventions, wherein the measuring instrument transmits unique ID information assigned to each of the measuring instruments, along with data related to the measurement result.

Here, in addition to the data related to the measurement result transmitted from the measuring instrument, unique ID information assigned to each measuring instrument is also transmitted.

Consequently, when data is not received a predetermined number of times within the predetermined length of time, the abnormality detector confirms the ID information for the measuring instrument that has not received the data the predetermined number of times, and this makes it easy to recognize in which measuring instrument an abnormality has occurred.

The power distribution network monitoring system according to the ninth invention is the power distribution network monitoring system according to any of the first to the eighth inventions, wherein the measuring instrument transmits position information indicating the place where the measuring instrument is installed, along with data related to the measurement result.

Here, in addition to the data related to the measurement result transmitted from the measuring instrument, position information indicating the installation location of the measuring instrument is transmitted.

Consequently, when data is not received a predetermined number of times within the predetermined length of time, the abnormality detector confirms the position information for the installation position of the measuring instrument that has not received data the predetermined number of times, and this makes it easy to recognize the place in which an abnormality has occurred in a measuring instrument.

The power distribution network monitoring system according to the tenth invention is the power distribution network monitoring system according to any of the first to the ninth inventions, wherein the measuring instrument transmits time information indicating the date and time when the measurement was performed in the measuring instrument, along with data related to the measurement result.

Here, in addition to data related to the measurement result transmitted from the measuring instrument, information about the time at which the measurement by the measuring instrument was performed is transmitted.

Consequently, when data is not received a predetermined number of times within the predetermined length of time, the abnormality detector confirms the blank measurement time of the measuring instrument which has not received data the predetermined number of times, which makes it easy to recognize the time at which the abnormality occurred.

The power distribution network monitoring device according to the eleventh invention is a power distribution network monitoring device that detects an abnormality that has occurred in a power distribution network using measuring instruments installed in the power distribution network, the power distribution network monitoring system comprising a receiver and an abnormality detector. The receiver is installed at a specific position on a power line constituting the power distribution network and receives data related to measurement result from a plurality of measuring instruments that perform electrical measurement of the power line. The abnormality detector determines whether or not data related to the measurement result received by the receiver has been received a predetermined number of times within a predetermined length of time, and detects the abnormality.

Here, in a system that detects various abnormalities that occur in a power distribution network using measuring instruments installed on the power lines constituting the power distribution network, the abnormality detector determines whether or not data related to the result of electrical measurement of the power line measured by the measuring instrument has been received a predetermined number of times within a predetermined length of time, and detects the abnormality.

That is, with this power distribution network monitoring system, for example, data about the measurement result is set to be transmitted from the measuring instrument to the abnormality detector each time a predetermined length of time elapses, and if the measurement result has not been received a predetermined number of times (such as ten times) within a predetermined length of time (such as 60 minutes), it is determined that some kind of abnormality has occurred in the measuring instrument or in the power distribution network.

Here, abnormalities occurring in the distribution network include, for example, failure, destruction, or theft of a measuring instrument, communication failure between a measuring instrument and the abnormality detector, and the like, in addition to a power outage in the power distribution network.

The data related to the measurement result that is transmitted from the measuring instrument may be, for example, data about the measurement result for the current and voltage of the power line, or data about the effective value of the alternating current calculated from the measurement value.

Communication between the measuring instrument and the abnormality detector is not limited to direct communication, and may be indirect communication via a relay or the like. Furthermore, communication between the measuring instrument and the abnormality detector may be wireless communication or wired communication.

Furthermore, the abnormality detector may be provided inside the measuring instrument, or may be provided to a device other than the measurement component.

Consequently, when the measuring instrument and the power distribution network are normal, data about the measurement result can be received a predetermined number of times within a predetermined length of time, but if the data is not received the predetermined number times, it is determined that some kind of abnormality has occurred, and the conclusion is that there is an abnormality.

As a result, when data related to the measurement result is not properly received using the measuring instrument installed in a power line constituting the power distribution network, the occurrence of an abnormality in the power distribution network can be effectively detected.

Advantageous Effects

With the power distribution network monitoring system according to the present invention, it is possible to effectively detect the occurrence of an abnormality on a power distribution network including a power line to which a measuring instrument is attached.

BRIEF DESCRIPTION OF DRAWINGS

FIG. 7 is a table of measurement information stored in a management database of a power management center included in the power distribution network monitoring system in FIG. 1;

FIG. 8 is a table of setting information stored in a management database of a data collection relay included in the power distribution network monitoring system in FIG. 1;

FIG. 9 is a table of measurement information stored in a management database of a data collection relay included in the power distribution network monitoring system in FIG. 1;

FIG. 14 is a position information management table stored in a management database of a power management center included in the power distribution network monitoring system according to yet another embodiment of the present invention.

DESCRIPTION OF EMBODIMENTS

The power distribution network monitoring system 1 according to an embodiment of the present invention will be described below with reference to FIGS. 1 to 12.

Configuration of Power Distribution Network System 10

Figure 1:
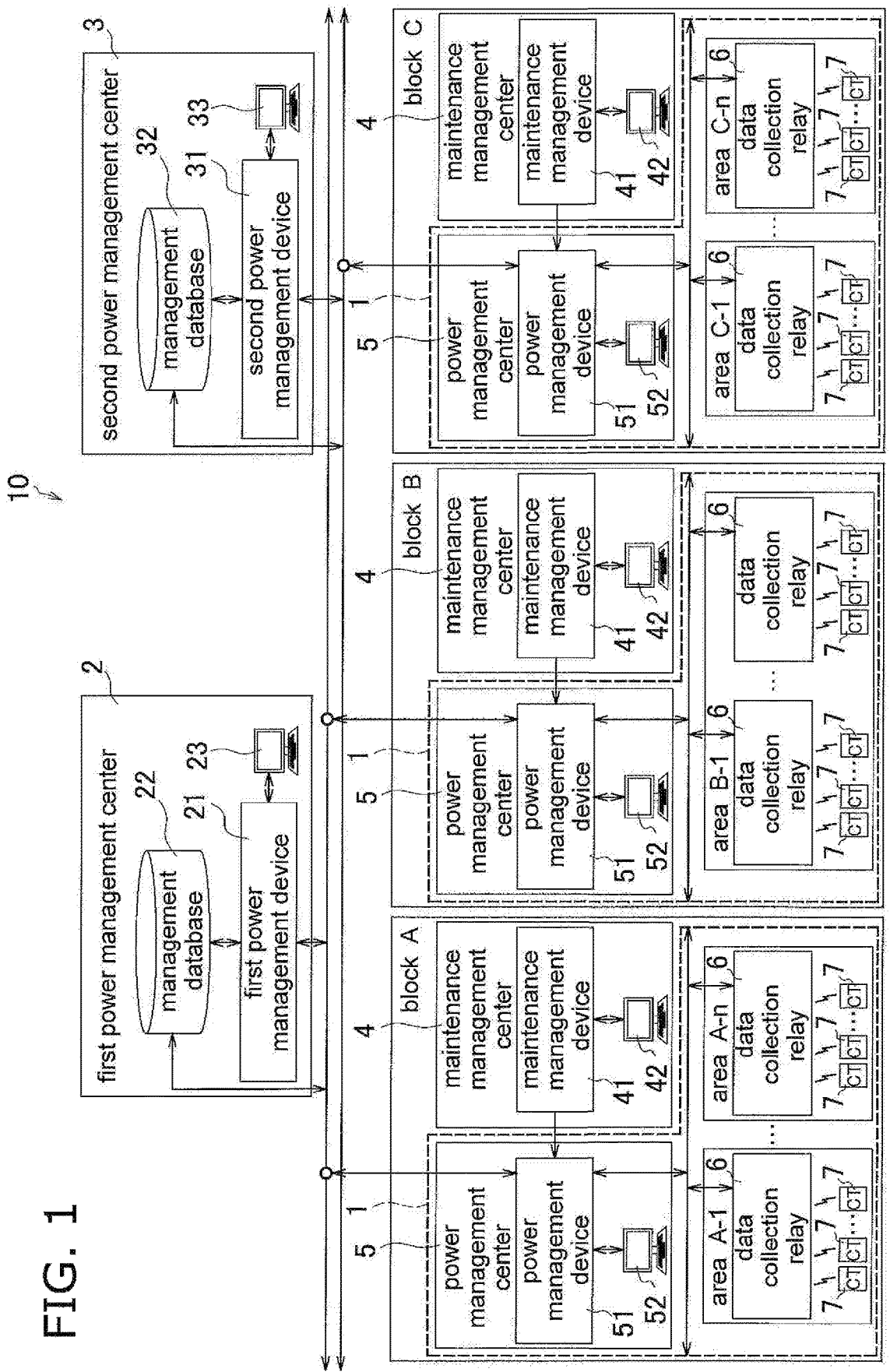
FIG. 1 is a block diagram of the configuration of a power distribution network system including the power distribution network monitoring system according to an embodiment of the present invention.

FIG. 1 is a block diagram of the configuration of a power distribution network system 10 including the power distribution network monitoring system 1 according to an embodiment of the present invention.

The power distribution network monitoring system 1 in this embodiment is provided to the power distribution network system 10. The power distribution network monitoring system 1 monitors a power distribution network and detects abnormalities by using a plurality of CT (current transformer) sensors (an example of a measuring instrument) 7 installed at predetermined positions of the power distribution lines constituting the power distribution network.

A first power management center 2 and a second power management center 3 are provided to the power distribution network system 10 of this embodiment. The first power management center 2 manages the power distribution network in blocks A and B. The second power management center 3 is manages the power distribution network in block C.

Here, the first power management center 2 and the second power management center 3 are, for example, management centers provided to Kansai Electric Power, Chubu Electric Power, or the like. Also, blocks A and B indicate, for example, prefectures covered by Kansai Electric Power, such as Osaka Prefecture or Nara Prefecture, and block C indicates prefectures covered by Chubu Electric Power, such as Aichi Prefecture.

The power distribution network system 10 of this embodiment comprises a power distribution network monitoring system 1 and a maintenance management center 4 in each of the blocks A, B, and C.

The power distribution network monitoring system 1 monitors the power distribution network 100 (see FIG. 2) in each block and detects abnormalities. The maintenance management center 4 performs maintenance management for each block on the basis of the detection result from the power distribution network monitoring system 1. The power distribution network monitoring system 1 has a power management center 5, a plurality of data collection relays 6, and a plurality of CT sensors 7.

The power management center 5 manages the power in each block and detects abnormalities in the power distribution network 100 (see FIG. 2) within a block.

The data collection relays 6 collect data from the CT sensors 7.

A plurality of CT sensors 7 are installed in each of the electrical areas flowing through the distribution line, and measure the current of the distribution line. Data related to the current value of the distribution line measured by the CT sensor 7 is sent to the power management center 5 via the data collection relay 6. The power management center 5 detects an abnormality on the basis of data indicating the measurement result of this current value.

Abnormality detection in the power management center 5 will be described in detail below.

Here, the area shown in FIG. 1 indicates, for example, a section transmitted from a predetermined substation in a block, or a municipal section such as a city or a town.

In block A, one data collection relay 6 is provided for each of a plurality of areas A-1 to A-n, and the data of a plurality of CT sensors 7 installed in one area is collected by a single data collection relay 6.

In block B, a plurality of data collection relays 6 are provided in one area B-1, and the data of the plurality of CT sensors 7 installed in one area is collected by a plurality of data collection relays 6. In the case of block B, the plurality of CT sensors 7 are divided into groups, and each data collection relay 6 collects data from the plurality of CT sensors 7 belonging to that group.

As shown in FIG. 1, only one data collection relay 6 may be provided in an area, or a plurality may be provided.

Installation of Data Collection Relays 6 and CT Sensors 7

Figure 2:
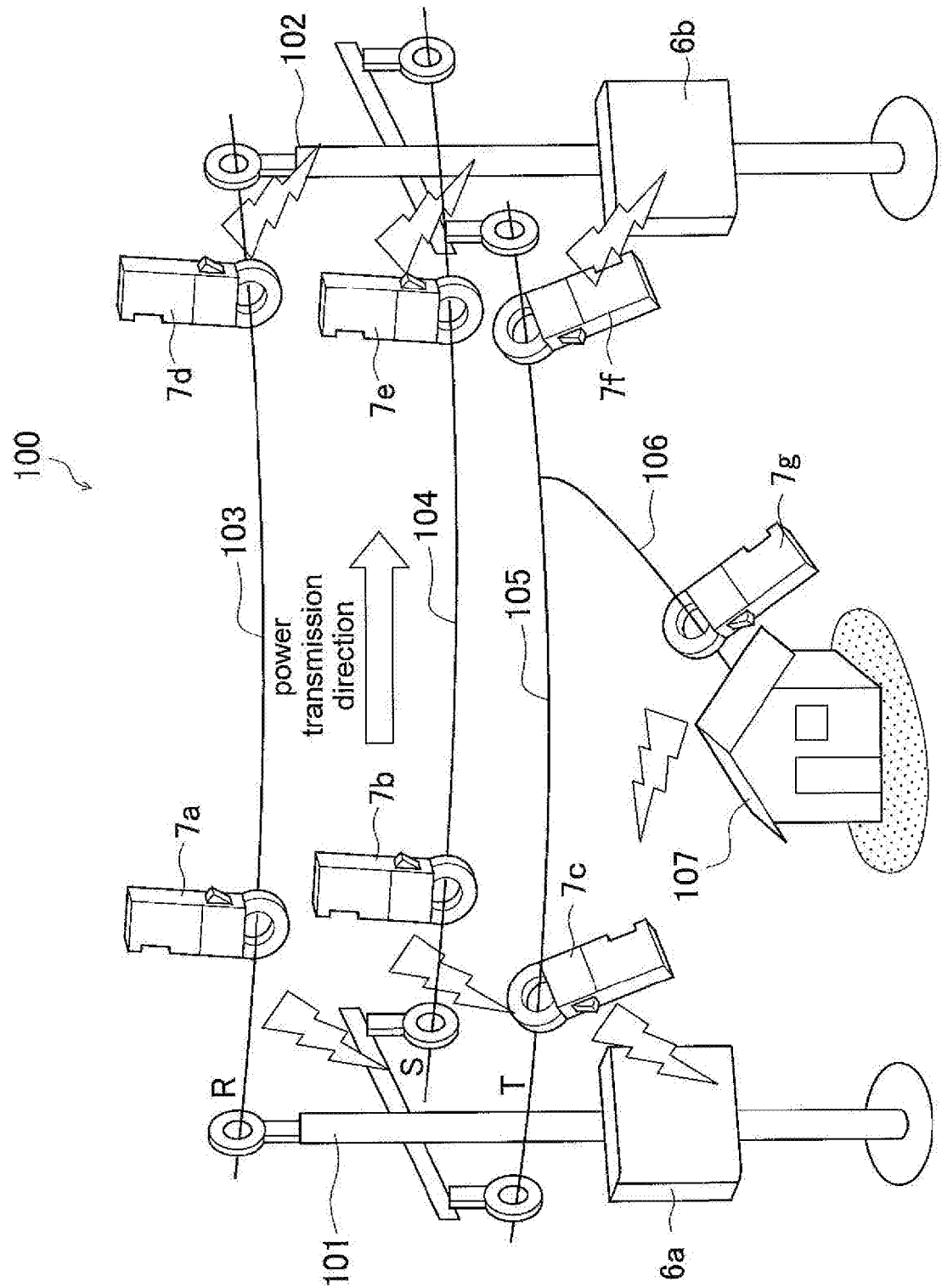
FIG. 2 shows a state in which CT sensors included in the power distribution network monitoring system in FIG. 1 are attached to power lines constituting a power distribution network.

FIG. 2 shows the installation locations of the data collection relays 6 and the CT sensors 7 in the power distribution network 100. In FIG. 2, a power pole 101 on the upstream side in the power transmission direction and a power pole 102 on the downstream side are shown. Distribution lines 103, 104, and 105, serving as three trunk lines constituting three phases of RTS, are strung between the power pole 101 and the power pole 102.

The distribution line 103 is an R-phase distribution line, the distribution line 104 is a T-phase distribution line, and the distribution line 105 is an S-phase distribution line. Also, a distribution line 106 branches off from the distribution line 105 as a branch line, and is connected to the electrical box of a house 107.

A data collection relay 6 is installed on each of the power poles 101 and 102. In order to distinguish them by location, the data collection relay 6 installed on the power pole 101 is numbered 6a, and the data collection relay 6 installed on the power pole 102 is 6b.

The CT sensors 7 are a clamp type, and are detachably installed on a distribution line (an example of a power line). The CT sensors 7 are installed near the power pole 101 and near the power pole 102 on each of the distribution lines 103, 104, and 105

A CT sensor 7 is also installed near the house 107 on the distribution line 106. Here, a to f are added to the reference numbers of the CT sensors 7 so that they can be distinguished by their location in the description that follows.

More specifically, the CT sensor 7 installed near the power pole 101 on the distribution line 103 is labeled 7a, and the CT sensor 7 installed near power pole 102 on the distribution line 103 is 7d. The CT sensor 7 installed near the power pole 101 on the distribution line 104 is labeled 7b, and the CT sensor 7 installed near the power pole 102 on the distribution line 104 is 7e. The CT sensor 7 installed near the power pole 101 on the distribution line 105 is labeled 7c, and the CT sensor 7 near the power pole 102 on the distribution line 105 is 7f. The CT sensor 7 installed on the distribution line 106 is labeled 7g.

In FIG. 2, the measurement data of the CT sensors 7a, 7b, 7c, and 7g is transmitted to the data collection relay 6a, and the data of the CT sensors 7d, 7e, and 7f is transmitted to the data collection relay 6b. Communication between the CT sensors 7 and the data collection relays 6 is performed wirelessly as discussed below.

First and Second Power Management Centers 2 and 3

As shown in FIG. 1, the first power management center 2 has a first power management device 21, a management database 22, and a display unit 23.

Figure 3:
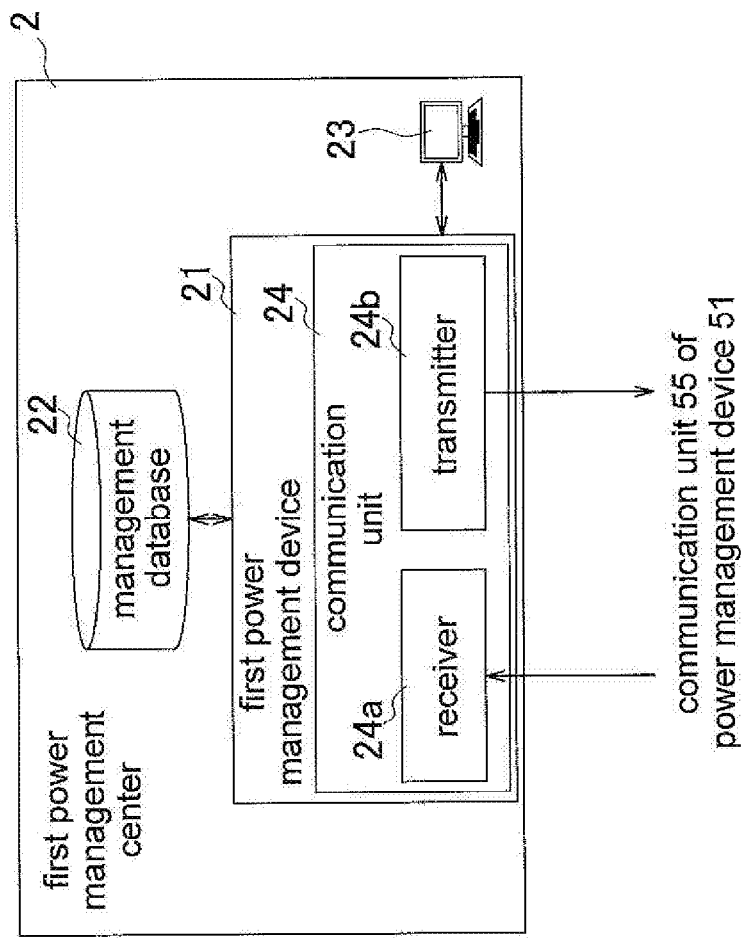
FIG. 3 is a block diagram of the configuration of a first power management center included in the power distribution network system in FIG. 1.

As shown in FIG. 3, the first power management device 21 has a communication unit 24 including a receiver 24a and a transmitter 24b, and communicates with the power management center 5 provided in each of the blocks A and B. The first power management device 21 uses the communication unit 24 to receive the detection result data obtained by each power management device 51, stores the data in the management database 22, and displays it on the display unit 23.

The abnormality detection result data includes data such as the ID and position of the CT sensor 7 which measured the measurement data in which the abnormality was detected, and the measurement time of the measurement data in which the abnormality was detected.

Thus leaving a record of abnormality detection in the management database 22 makes it possible for the host power management centers 2 and 3 to take some kind of measure against an abnormality that has occurred in the power distribution network 100 (see FIG. 2), so maintenance and management can be performed more easily than in the past.

The second power management center 3 has the same configuration as that of the first power management center 2, and will therefore not be described again in detail.

More specifically, like the first power management center 2, the second power management center 3 has a second power management device 31 having a communication unit provided with a transmitter and a receiver, as well as a management database 32 and a display unit 33.

Also, the second power management center 3 communicates with the power management center 5 provided in block C, and stores information related to abnormalities detected by the power management center 5.

Power Management Center 5

As shown in FIG. 1, the power management center 5 has a power management device 51 and a display unit 52.

The power management device 51 uses the data of the measurement result received from the data collection relay 6 to detect an abnormality in the power distribution network 100 (see FIG. 2). The abnormality detection processing performed by the power management device 51 will be described in detail below.

Figure 4:
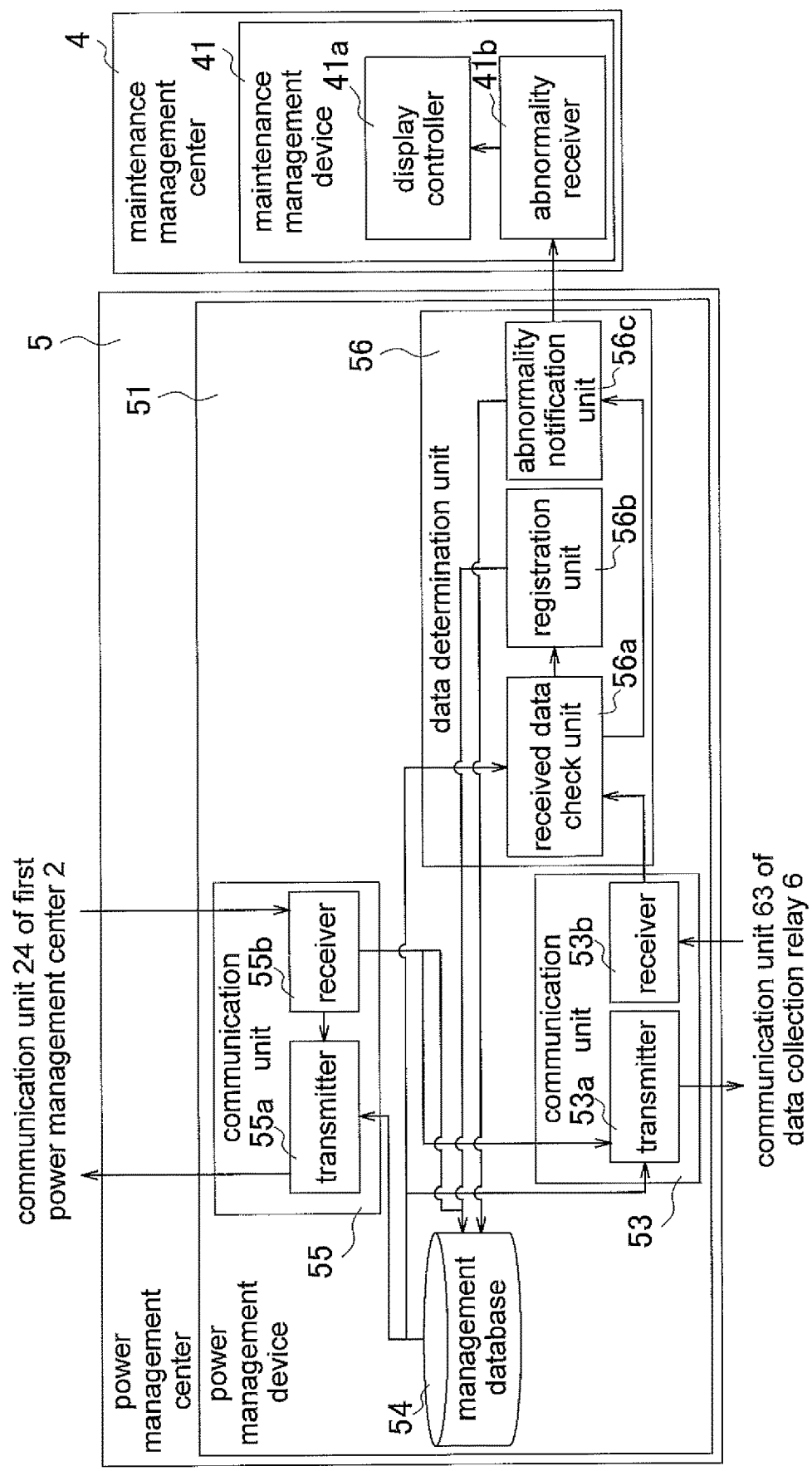
FIG. 4 is a block diagram of the configuration of a power management center included in the power distribution network monitoring system in FIG. 1.

FIG. 4 is a block diagram of the configuration of the power management center 5 and the maintenance management center 4.

As shown in FIG. 4, the power management device 51 included in the power management center 5 has a communication unit 53, a management database (an example of a storage unit) 54, a communication unit 55, and a data determination unit (an example of an abnormality detector) 56.

The communication unit 53 communicates with the communication unit 63 (see FIG. 5) on the data collection relay 6 side. The communication unit 53 has a transmitter 53a and a receiver 53b, as shown in FIG. 4.

The transmitter 53a transmits a setting request and a data acquisition request to each data collection relay 6.

The receiver 53b receives various data, such as the area code, the relay management code, the CT sensor ID, the time information, and the measurement result transmitted from the transmitters 63b (see FIG. 5) of the plurality of data collection relays 6.

The management database 54 stores various data, such as the area code, relay management code, CT sensor ID, time information, and measurement result received from the data collection relay 6 via the receiver 53b.

In this embodiment, data about the measurement result is transmitted from the CT sensor 7 to the data collection relay 6 every six minutes, and a data acquisition request is transmitted from the power management device 51 to the data collection relay 6 every 60 minutes.

Consequently, data about the measurement results for ten times are transmitted all at once from the data collection relay 6 to the power management device 51.

The management database 54 stores data about the measurement result (the effective value of the current, etc.) as a table along with the area code, relay management code, CT sensor ID, and time information.

In particular, in this embodiment, the management database 54 also stores information related to the result of abnormality detection (whether or not there is an abnormality, and the CT sensor 7 and data collection relay 6 in which the abnormality was detected).

Figures 5, 6:
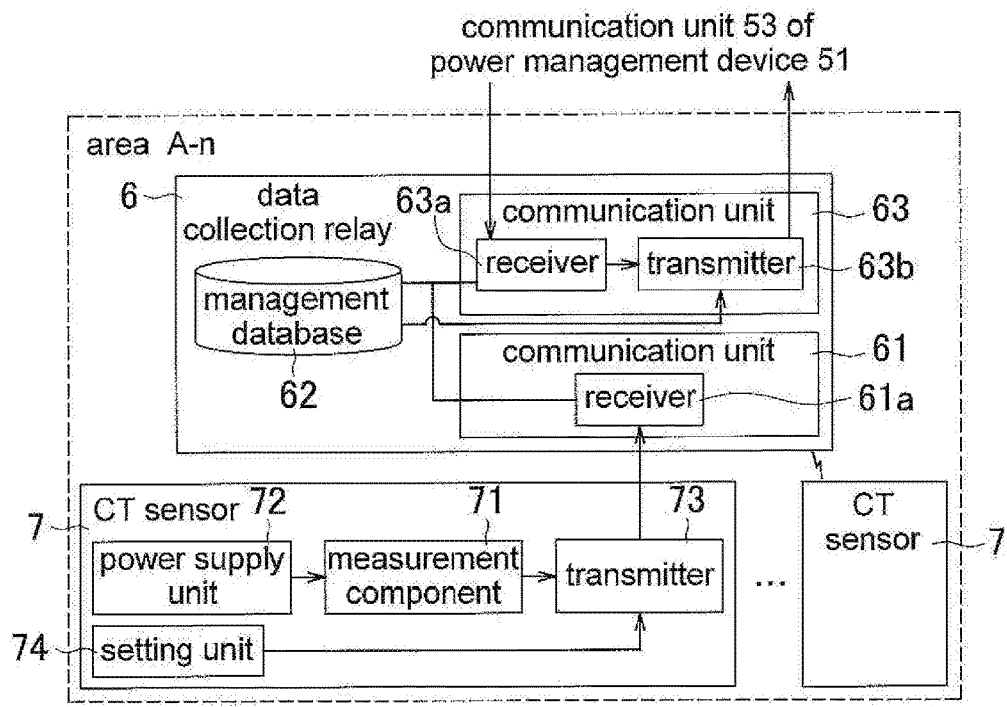
FIG. 5 is a block diagram of the configuration of a data collection relay and a CT sensor included in the power distribution network monitoring system in FIG. 1.
FIG. 6 is a table of setting information stored in a management database of a power management center included in the power distribution network monitoring system in FIG. 1.

More specifically, setting information received from the first power management center 2 shown in FIG. 6 is stored in the management database 54.

The setting information includes relay management codes (A01_01, . . . , A01_n) and (A02_01, A02_02, . . . , A02_n) corresponding to the area code (A01) and the area code (A02), CT sensor IDs (001, 002, . . . , 00n) and (001, 002, . . . , 00n), and time information (2017/2/6 09:58:55).

The setting information is updated whenever new setting information is received from the first power management center 2.

Furthermore, the management database 54 stores the measurement information received from the data collection relay 6 shown in FIG. 7.

This measurement information includes relay management codes (A01_01, A01_2) and (A02_01) corresponding to the area code (A01) and the area code (A02), CT sensor IDs (001, 002, . . . ) and (001), time information, and measurement results.

The table in FIG. 7 shows that data indicating 10 measurement results (100 mA, 101 mA, . . . , 104 mA) was received in the 60-minute period from 09:02:30 on Feb. 6, 2017, to 09:56:30 on the same day from the CT sensor 7 with the CT sensor ID 001 that communicates with the data collection relay 6 with the relay management code A01_01, in the area with the area code A01.

Also, the table in FIG. 7 shows that some kind of abnormality has occurred in the power distribution network 100 (see FIG. 2), such as theft, damage, or failure of the CT sensors 7 or the data collection relays 6, or a power outage in the area with the area code A01, because only one measurement result has been received within 60 minutes (during the 9:00 hour on Feb. 6, 2017) from the CT sensor 7 with the CT sensor ID 002 that communicates with the data collection relay 6 with the relay management code A01_01, in the area with the area code A01.

The communication unit 55 communicates with the communication unit 24 (see FIG. 3) on the first power management center 2 side. As shown in FIG. 4, the communication unit 55 has a transmitter 55a and a receiver 55b.

The transmitter 55a transmits various data to the receiver 24a included in the communication unit 24 on the first power management center 2 side.

The receiver 55b receives various data and commands transmitted from the transmitter 24b included in the communication unit 24 on the first power management center 2 side.

The data determination unit 56 detects abnormalities in the power distribution network 100 (see FIG. 2) on the basis of the number of times data about the measurement results stored in the management database 54 has been acquired. More specifically, the data determination unit 56 confirms whether or not the number of receptions of a measurement result by a CT sensor 7 in a 60-minute period (a predetermined length of time) is ten times (a predetermined number of times). If the measurement result has not been received ten times, the data determination unit 56 determines that some kind of abnormality has occurred.

Here, abnormalities that are detected by the power distribution network monitoring system 1 of this embodiment include, for example, theft, damage, or failure of a CT sensor 7 or a data collection relay 6, a communication abnormality between a CT sensor 7 and a data collection relay 6, communication failure between a data collection relay 6 and the power management device 51, and a power outage.

That is, when these abnormalities occur in the power distribution network 100 (see FIG. 2) in which a plurality of CT sensors 7 are installed, the measurement results in the CT sensors 7 are not transmitted to the power management device 51.

Accordingly, with the power distribution network monitoring system 1 in this embodiment, data for effective values related to measurement results transmitted via the data collection relay 6 is acquired every 60 minutes for each individual CT sensor 7 for which measurement is performed every six minutes, and the presence or absence of an abnormality is determined depending on whether or not the number of measurements is ten.

As shown in FIG. 4, the data determination unit 56 has a received data check unit 56a, a registration unit 56b, and an abnormality notification unit (an example of a report unit) 56c.

The received data check unit 56a checks the number of receptions of the measurement result for the CT sensor 7 received through the receiver 53b of the communication unit 53, and determines whether or not the number of receptions is a predetermined number of times set in advance.

More specifically, the received data check unit 56a confirms whether or not 60 minutes' worth of measurement results produced by the CT sensor 7 (10 times under normal circumstances) have been received.

Here, if measurement data for ten times has not been received in 60 minutes, the received data check unit 56a determines that some kind of abnormality has occurred in the power distribution network 100 (see FIG. 2), and data about the measurement result and the determination result are transmitted to the registration unit 56b and the abnormality notification unit 56c.

The registration unit 56b stores the result determined by the received data check unit 56a, and the data of the measurement result, in the management database 54.

The abnormality notification unit 56c transmits abnormality determination, which includes the CT sensor ID of the CT sensor 7 in which the abnormality has occurred, the relay device management code of the data collection relay 6 to which that CT sensor 7 is connected, the area code in which the CT sensor 7 is installed, and so forth, to the abnormality receiver 41b of the maintenance management center 4, on the basis of a determination result in the received data check unit 56a which determines that there is an abnormality.

Maintenance Management Center 4

The maintenance management center 4 performs maintenance management of the power distribution network 100 on the basis of the notification of abnormality detection result data from the power management center 5. That is, the maintenance management center 4 performs management such as dispatching a worker to actually check the installation location of the CT sensor 7 that has transmitted data such as a measurement result in which an abnormality was detected. As shown in FIG. 1, the maintenance management center 4 has a maintenance management device 41 and a display unit 42.

As shown in FIG. 4, the maintenance management device 41 has a display controller 41a and an abnormality receiver 41b.

The display controller 41a displays the ID and so forth of the CT sensor 7, the data collection relay 6, etc., in which an abnormality has occurred, on the basis of the result of the abnormality detection received from the abnormality notification unit 56c of the data determination unit 56 (see FIG. 1).

The abnormality receiver 41b receives data related to the result of the abnormality detection transmitted from the abnormality notification unit 56c of the power management device 51, and the like.

The display unit 42 is controlled by the display controller 41a so as to display data about the measurement results of each CT sensor 7, or text information indicating the occurrence of an abnormality in the power distribution network 100, or the like. Consequently, the manager can confirm the abnormality detection result and so forth displayed on the display unit 42, and can perform maintenance and management such as dispatching a worker to the site as needed.

CT Sensor 7

FIG. 5 is a block diagram of the configuration of the data collection relay 6 and the CT sensor 7 in the area A-n.

As shown in FIG. 2, the CT sensor 7 has a clip-type attachment structure, and can be removably attached to the distribution lines 103, 104, 105, 106, etc. Accordingly, there is a risk that the CT sensors 7 attached to the distribution lines 103 to 106, etc., may be subjected to theft, damage, or the like.

As shown in FIG. 5, the CT sensor 7 includes a measurement component 71, a power supply unit 72, a transmitter 73, and a setting unit 74.

The measurement component 71 measures the trend of the current flowing through the distribution line due to the power supply from the power supply unit 72. More specifically, the measurement component 71 has a coil unit removably attached around the distribution line, a shunt resistor for measuring the current flowing through the coil unit, and so forth. Therefore, the measurement component 71 can sense the current flowing through the distribution line by measuring the voltage at both ends of the shunt resistor.

Also, the measurement component 71 is provided with an operation unit (not shown), and the effective value of the current is calculated from the waveform of the sensed current.

The power supply unit 72 functions as a power supply that stores the electricity generated in the coil unit and supplies it to the measurement component 71. A component is provided for switching the electrical circuit so that when power is stored in the power supply unit 72, measurement is not performed by the measurement component 71, and the current produced by the coil unit is sent to the power supply unit 72.

The setting unit 74 sets the area code in which a CT sensor 7 is installed, a management code for identifying a communicable data collection relay 6, a CT sensor ID for identifying a CT sensor 7, the measurement time, the measurement interval, the number of measurements, etc.

The transmitter 73 transmits the data (effective value of current, etc.) measured and calculated by the measurement component 71 as measurement result data to the data collection relay 6. This measurement result data is used for detecting abnormalities in the power management device 51.

In addition to the measurement result data, the transmitter 73 transmits as measurement information, the sensor ID, time information, and the like set by the setting unit 74 in association with the measurement result data.

The time information transmitted in association with the measurement result data indicates the time at which the measurement result data was measured at each CT sensor 7. The CT sensor 7 transmits the sensor ID, time information, and measurement result data to the data collection relay 6 periodically, such as at six-minute intervals.

Data Collection Relay 6

As shown in FIG. 5, the data collection relay 6 has a communication unit 61, a management database 62, and a communication unit 63.

The communication unit 61 performs wireless communication with the plurality of CT sensors 7. The communication unit 61 has a receiver 61a.

The receiver 61a receives the measurement information (sensor ID, time information, and measurement result data) transmitted from the plurality of CT sensors 7 via wireless communication.

The management database 62 stores (as a table) and manages the setting information (see the table in FIG. 8) and measurement information (see table in FIG. 9) transmitted from the plurality of CT sensors 7.

More specifically, the management database 62 stores the setting information received from the power management device 51 shown in FIG. 8.

This setting information includes the CT sensors ID (001, 002, . . . , 00n) corresponding to the relay's own relay management code (A01_01), and time information (2017/2/6, 10:00:08).

This setting information is updated whenever new setting information is received from the power management device 51.

Furthermore, the measurement information received from the plurality of CT sensors 7 shown in FIG. 9 is stored in the management database 62.

This measurement information includes CT sensor IDs (001, 002, 003, . . . ), time information, and measurement results.

The table in FIG. 9 shows that data indicating ten measurement results (100 mA, 101 mA, . . . , 104 mA) was received in the 60-minute period from 09:02:30 on Feb. 6, 2017, to 09:56:30 on the same day from the CT sensor 7 with the CT sensor ID 001.

Also, the table in FIG. 9 shows that data indicating two measurement results was received between 09:03:42 and 09:09:42 on Feb. 6, 2017, from the CT sensor 7 with the CT sensor ID 001. That is, this means that only two measurement results were received in 60 minutes from the CT sensor 7 with the CT sensor ID 002.

As shown in FIG. 1, the communication unit 63 communicates with the power management device 51 in block A, etc. The communication unit 63 has a receiver 63a and a transmitter 63b.

The receiver 63a receives a setting request and a data acquisition request from the power management device 51 of the power management center 5. The data acquisition request is transmitted periodically (for example, every 60 minutes) from the power management center 5. The setting request requests the setting of the ID of the data collection relay 6.

The transmitter 63b transmits the sensor ID, the time information, the measurement result data, and the data collection relay ID to the power management device 51 of the power management center 5.

Flow of Abnormality Detection Processing

The flow of processing for abnormality detection in the power distribution network 100 (see FIG. 2) by the power distribution network monitoring system 1 of this embodiment will now be described.

Processing in CT Sensor 7

Figure 10:
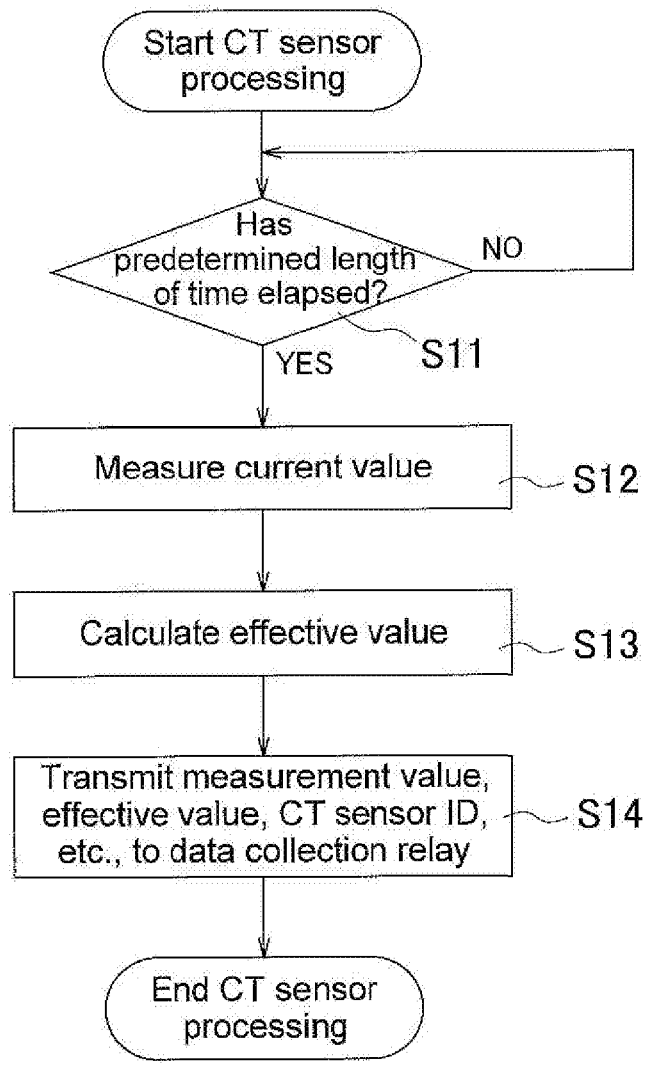
FIG. 10 is a flowchart of the flow of processing in a CT sensor included in the power distribution network monitoring system in FIG. 1.

As shown in FIG. 10, in step S11 the CT sensor 7 determines whether or not a specific, preset length of time (such as six minutes) has elapsed. The system waits until the predetermined length of time has elapsed, and once it has, the flow proceeds to step S12.

The predetermined length of time set here corresponds to how long charging is performed at the power supply unit 72.

Next, in step S12 the measurement component 71 of the CT sensor 7 measures the value of the current flowing through the distribution line (an example of a power line).

Next, in step S13 an operation unit (not shown) of the CT sensor 7 calculates the effective value from the measured current value.

Next, in step S14 measurement information including the measurement value measured by the measurement component 71, the effective value calculated by the operation unit, the unique CT sensor ID assigned to each CT sensor 7, and so forth are transmitted by the transmitter 73 of the CT sensor 7 to the data collection relay 6.

Processing at Data Collection Relay 6

Figure 11:
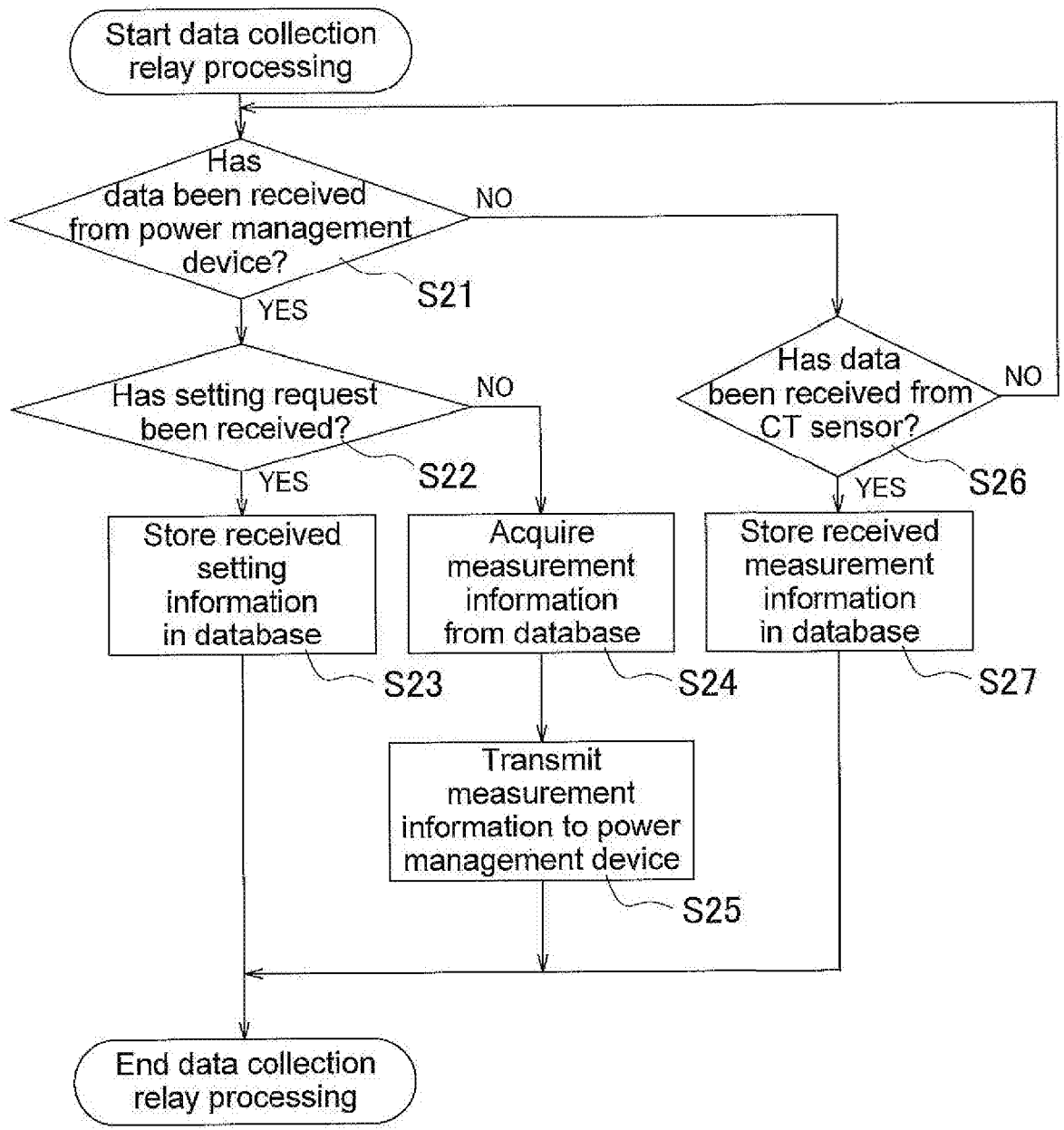
FIG. 11 is a flowchart of the flow of processing in a data collection relay included in the power distribution network monitoring system in FIG. 1.

As shown in FIG. 11, in step S21 the data collection relay 6 determines whether or not the receiver 63a of the communication unit 63 has received data from the power management device 51. If data has been received from the power management device 51, the flow proceeds to step S22. On the other hand, if no data has been received from the power management device 51, the flow proceeds to step S26.

Next, in step S22, if data has been received from the power management device 51, it is determined whether or not the data includes a setting request. Here, if the data includes a setting request, the flow proceeds to step S23. On the other hand, if the data does not include a setting request, the flow proceeds to step S24.

Next, in step S23, if data has been received from the power management device 51 and it includes a setting request, the information included in the received setting request is stored in the management database 62, and the processing is ended.

Next, in step S24, if data has been received from the power management device 51 and a setting request is not included, measurement information related to the current value (effective value) measured by the CT sensor 7 is acquired from the management database 62.

Next, in step S25 the measurement information is transmitted from the transmitter 63b of the communication unit 63 to the power management device 51 (the receiver 53b of the communication unit 53), and the processing is ended.

Next, in step S26, if data has not been received from the power management device 51, it is determined whether or not data has been received from the CT sensor 7. Here, if data has been received from the CT sensor 7, the flow proceeds to step S27. On the other hand, if data has not been received from the CT sensor 7, the flow returns to step S21.

Next, in step S27, if data has not been received from the power management device 51, but data has been received from the CT sensor 7, the received measurement information is stored in the management database 62, and the processing is ended.

Processing in Power Management Device 51

Figure 12:
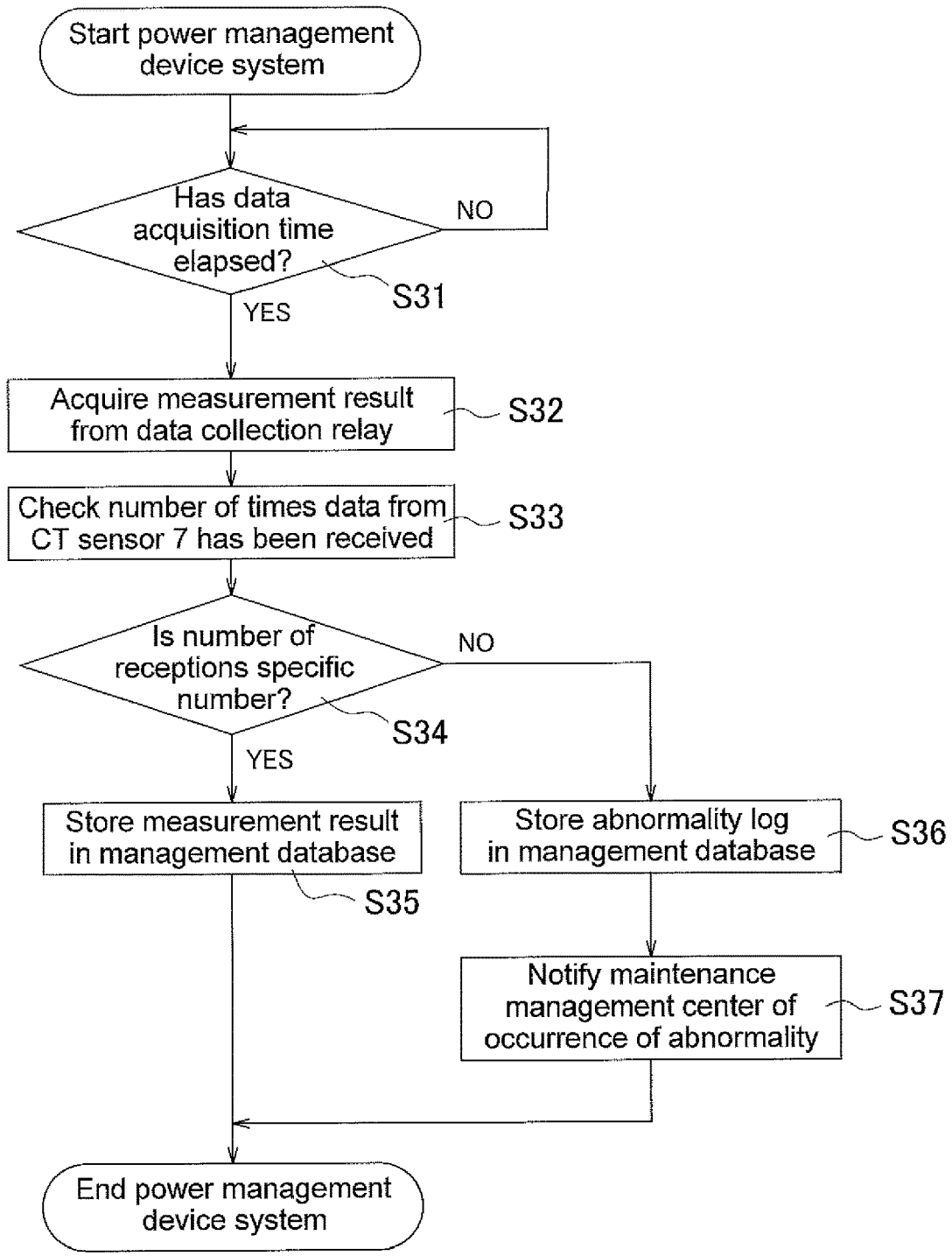
FIG. 12 is a flowchart of the flow of processing in abnormality determination by the power distribution network monitoring system in FIG. 1.

As shown in FIG. 12, in step S31 the power management device 51 determines whether or not a preset data acquisition time (such as 60 minutes) has elapsed. Here, if the data acquisition time has elapsed, the flow proceeds to step S32. If, however, the data acquisition time has not elapsed, the system waits until the data acquisition time elapses.

Next, in step S32, since the data acquisition time has elapsed, 60 minutes' worth of measurement results (10 times if normal) by the CT sensor 7 are acquired from the transmitter 63b of the communication unit 63 of the data collection relay 6 by the receiver 53b of the communication unit 53.

Next, in step S33 the received data check unit 56a of the data determination unit 56 checks the number of times the measurement result of the CT sensor 7 has been received.

Next, in step S34, as a result of confirmation at the received data check unit 56a, it is determined whether or not the number of receptions is equal to a specific, preset number.

More specifically, in this embodiment, the data determination unit 56 acquires data about measurement results corresponding to 60 minutes. Measurement of the current value in the CT sensor 7 is performed every six minutes. Therefore, if the communication status between the CT sensor 7 and the data collection relay 6 is normal, data for ten measurement results in 60 minutes should be included.

Here, if the number of times of times the measurement result has been received at the CT sensor 7 is the specified number of times (ten), the flow proceeds to step S35. On the other hand, if it is not the predetermined number of times (less than ten), the flow proceeds to step S36.

Next, in step S35 it is confirmed that the measurement results of the CT sensor 7 have been received a predetermined number of times (ten times) within a predetermined length of time (60 minutes), so it is determined that no abnormality has occurred (normal), the registration unit 56b stores the measurement result in the management database 54, and the processing is ended.

On the other hand, in step S36, it has been confirmed that the measurement results of the CT sensor 7 have not been received a predetermined number of times (ten) within a predetermined length of time (60 minutes), so it is determined that an abnormality has occurred, and the registration unit 56b stores information (a log) of the abnormality determination and the measurement result in the management database 54.

Next, in step S37 the abnormality notification unit 56c notifies the maintenance management device 41 of the occurrence of an abnormality in the power distribution network 100 (see FIG. 2), and the processing is ended.

With the power distribution network monitoring system 1 of this embodiment, whether or not any of various kinds of abnormality have occurred, such as theft, damage, or failure of the CT sensors 7 or the data collection relays 6, or a power outage, is determined according to whether or not the number of receptions of data related to the measurement result in the CT sensor 7 is a predetermined number.

Consequently, by transmitting information related to the occurrence of an abnormality to the maintenance management center 4 or the like, for example, it can be reported that an abnormality has occurred in the power distribution network 100 (see FIG. 2) in which the CT sensor 7 is installed, and maintenance and management can be easily carried out.

Also, with the power distribution network monitoring system 1 of this embodiment, when an abnormality determination is carried out, the approximate position where the abnormality has occurred can be easily identified on the basis of the unique ID assigned to the CT sensor 7 in which the abnormality has occurred, the ID of the data collection relay 6 to which that CT sensor 7 is connected, information about the area in which the CT sensor 7 is installed, and other such information.

As a result, when some kind of abnormality occurs in the power distribution network 100, maintenance and management of the power distribution network 100 can be performed more easily than in the past, such as checking the area around the position where the abnormality occurred.

Other Embodiments

An embodiment of the present invention was described above, but the present invention is not limited to or by the above embodiment, and various modifications are possible without departing from the gist of the invention.

(A)

In the above embodiment, an example was given in which the present invention was applied to the power distribution network monitoring system 1 that includes the CT sensors 7 and the data collection relays 6. However, the present invention is not limited to this.

Figure 13:
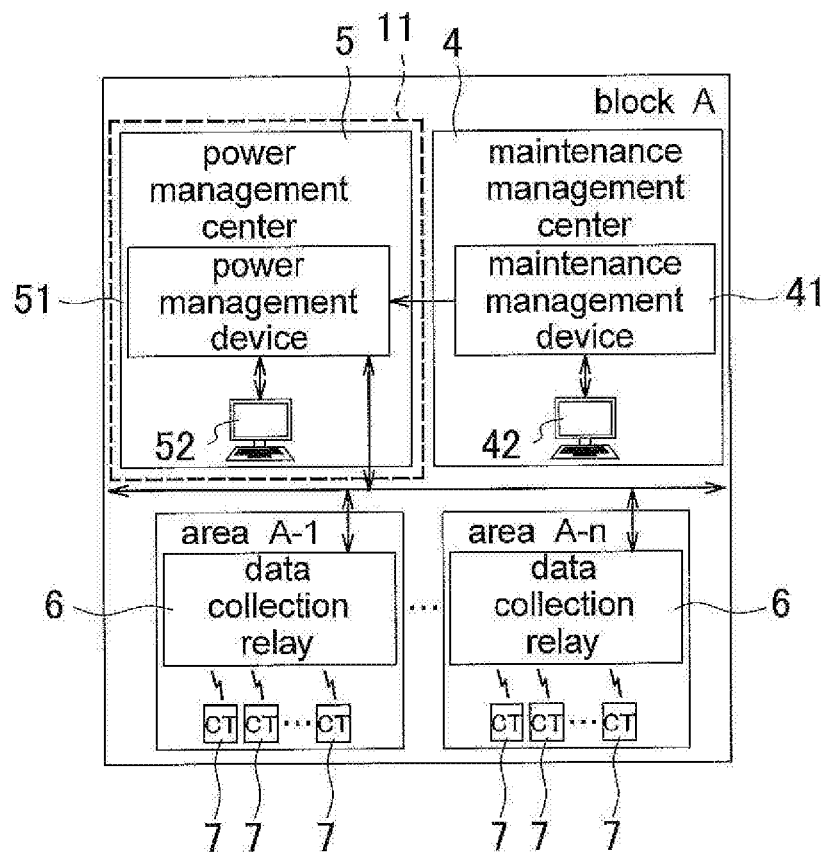
FIG. 13 is a block diagram of the configuration of a power distribution network monitoring device according to another embodiment of the present invention.

For example, as shown in FIG. 13, the present invention may be realized as a power distribution network monitoring device 11 that does not include a CT sensor or a data collection relay.

More specifically, the power distribution network monitoring device 11 counts the number of receptions of measurement result data at the CT sensor 7 as received from the data collection relay 6, and detects the occurrence of an abnormality according to whether or not there have been a predetermined number of receptions within a predetermined length of time.

Consequently, the same effect as that of the power distribution network monitoring system 1 in the above Embodiment 1 can be obtained.

(B)

In the above embodiment, an example was described in which the position information stored in the management database 54 of the power management device 51 did not include position information about the CT sensor 7. However, the present invention is not limited to this.

For example, as shown in FIG. 14, a position code indicating position information about a CT sensor may be stored in the management database in association with the area code, the relay management code, and the CT sensor ID.

In this case, since the installation location of the CT sensor where the abnormality has occurred can be easily recognized, a worker can be sent to the site where the abnormality has occurred for confirmation.

(C)

In the above embodiment, an example was given in which the measurement results of the plurality of CT sensors 7 were transmitted to the power management device 51 via the data collection relay 6, but the present invention is not limited to this.

For instance, the configuration may be such that the measurement results are transmitted directly to the power management device, without going through the data collection relay.

(D)

In the above embodiment, an example was given in which the effective value was calculated from the current value measured by a CT sensor 7, and the effective value was transmitted to the power management device 51 via the data collection relay 6 as data related to the measurement result. However, the present invention is not limited to this.

For instance, the result of an electrical measurement other than the effective value, such as the current value or the voltage value, may be used as data related to the measurement result.

(E)

In the above embodiment, an example was given in which an abnormality in the power distribution network 100 was detected according to whether or not the number of times the measurement result of the CT sensor 7 was acquired in 60 minutes was ten at the data determination unit 56 of the power management device 51. However, the present invention is not limited to this.

For instance, the predetermined length of time used for abnormality determination is not limited to 60 minutes, and may be set to a time shorter than 60 minutes, such as 10 minutes or 30 minutes. Alternatively, it may be set to a time longer than 60 minutes, such as 3 hours, 6 hours, 12 hours, or 24 hours.

Also, the predetermined number of times used for the abnormality determination is not limited to ten times in 60 minutes, and the appropriate number of times may be set to two times in 10 minutes or three times in 30 minutes, for example. Alternatively, if the predetermined length of time is a time longer than 60 minutes, such as 3 hours, 6 hours, 12 hours, or 24 hours, the number of times may be set to more than ten times, such as 20 times or 30 times.

(F)

In the above embodiment, an example was given in which, when the data determination unit 56 of the power management device 51 determines that an abnormality has occurred, information notifying of the occurrence of the abnormality is transmitted to the maintenance management center 4 via the abnormality notification unit 56c, and text information notifying of the occurrence of the abnormality is displayed on the display unit 42 in the maintenance management center 4. However, the present invention is not limited to this.

For instance, in addition to displaying text information on the display unit 42 of the maintenance management center 4, the method of reporting when an abnormality occurs may also involve some other reporting means, such as sending an e-mail to a portable terminal or the like of the worker who performs maintenance management.

(G)

In the above embodiment, an example was given in which wireless communication was used for communication between the plurality of CT sensors 7 and the data collection relay 6, and between the data collection relays 6 and the power management device 51. However, the present invention is not limited to this.

For instance, communication may be performed between the plurality of CT sensors 7 and the data collection relay 6 and/or between the data collection relays 6 and the power management device 51 by wired communication.

(H)

In the above embodiment, an example was given in which a CT sensor 7 having a power supply unit 72, etc., was used as a measuring instrument for measuring the current value of the distribution lines (power lines) constituting the power distribution network. However, the present invention is not limited to this.

For instance, some other measuring instrument, such as a current sensor having a power supply, may be used.

(I)

In the above embodiment, an example was given in which a CT sensor 7 was used to measure the current value of the distribution lines (power lines) 103 to 106 constituting the power distribution network 100. However, the present invention is not limited to this.

For instance, the electrical measurement performed in the measuring instrument is not limited to the measurement of the current value, and may instead be some other electrical measurement, such as a voltage value.

INDUSTRIAL APPLICABILITY

The power distribution network monitoring system of the present invention has the effect of being able to effectively detect the occurrence of abnormalities in a power distribution network including power lines to which current sensors are attached, and as such can be widely used in various kinds system for managing a power distribution network.

REFERENCE SIGNS LIST

1 power distribution network monitoring system
2 first power management center
3 second power management center
4 maintenance management center
5 power management center
6 data collection relay
6a, 6b data collection relay
7 CT sensor (measuring instrument)
7a to 7g CT sensors (measuring instruments)
10 power distribution network system
11 power distribution network monitoring device
21 first power management device
22 management database
23 display unit
31 second power management device
32 management database
33 display unit
41 maintenance management device
41a display controller
41b abnormality receiver
42 display unit
51 power management device
52 display unit
53 communication unit
53a transmitter
53b receiver
54 management database (storage unit)
55 communication unit
55a transmitter
55b receiver
56 data determination unit (abnormality detector)
56a received data check unit
56b registration unit
56c abnormality notification unit (reporting unit)

61 communication unit
61a receiver
62 management database
63 communication unit
63a receiver
63b transmitter
71 measurement component
72 power supply unit
73 transmitter
74 setting unit
100 power distribution network
101, 102 power pole
103, 104, 105, 106 distribution line (power line)
107 house

The invention claimed is:

1. A power distribution network monitoring system that detects abnormalities that occur in a power distribution network using measuring instruments installed in the power distribution network, the power distribution network monitoring system comprising:
 a plurality of measuring instruments that are installed at predetermined positions on power lines on an upstream side of a downmost-stream power demander, among the power lines constituting the power distribution network and configured to perform electrical measurement of the power lines; and
 an abnormality detector configured to determine whether or not data related to the measurement result measured by the measuring instrument has been received a predetermined number of times within a predetermined length of time, and detect the abnormality.

2. The power distribution network monitoring system according to claim 1, further comprising a data collection relay configured to receive data related to the measurement result from the plurality of measuring instruments and transmit the data to the abnormality detector.

3. The power distribution network monitoring system according to claim 2, wherein the data collection relay includes a first data collection relay that receives data related to the measurement result from the plurality of measuring instruments installed in a first area, and a second data collection relay that receives data related to the measurement result from the plurality of measuring instruments installed in a second area.

4. The power distribution network monitoring system according to claim 1, wherein the plurality of measuring instruments perform electrical measurement of the power line each time a predetermined length of time has elapsed.

5. The power distribution network monitoring system according to claim 1, further comprising a storage unit configured to store data related to the measurement result received from the plurality of measuring instruments and an abnormality detection result.

6. The power distribution network monitoring system according to claim 1, wherein the abnormalities include failure, theft, or destruction of the measuring instruments, a power outage in the power distribution network, and a communication failure between the measuring instruments and the abnormality detector.

7. The power distribution network monitoring system according to claim 1, further comprising a notification unit configured to give notification related to an abnormality when the abnormality detector has determined that there is an abnormality.

8. The power distribution network monitoring system according to claim 1, wherein the measuring instrument transmits unique ID information assigned to each of the measuring instruments, along with data related to the measurement result.

9. The power distribution network monitoring system according to claim 1, wherein the measuring instrument transmits position information indicating a place where the measuring instrument is installed, along with data related to the measurement result.

10. The power distribution network monitoring system according to claim 1, wherein the measuring instrument transmits time information indicating the date and time when a measurement was performed in the measuring instrument, along with data related to the measurement result.

11. A power distribution network monitoring device that detects an abnormality that has occurred in a power distribution network using measuring instruments installed in the power distribution network, the power distribution network monitoring device comprising:
 a receiver that is installed at a predetermined position on a power line on an upstream side of a downmost-stream power demander, among the power lines constituting the power distribution network and configured to receive data related to measurement result from a plurality of measuring instruments configured to perform electrical measurement of the power line; and
 an abnormality detector configured to determine whether or not data related to the measurement result received by the receiver has been received a predetermined number of times within a predetermined length of time, and detect the abnormality.

* * * * *